COUPLING TRANSISTOR LOGIC AND OTHER CIRCUITS

Filed Sept. 8, 1961 4 Sheets-Sheet 1

JAMES L. BUIE,
INVENTOR.

BY HIS ATTORNEYS.

Spensley & Horn.

COUPLING TRANSISTOR LOGIC AND OTHER CIRCUITS

Filed Sept. 8, 1961

JAMES L. BUIE,
INVENTOR.

BY HIS ATTORNEYS

Spensley & Horn.

LOGIC
$S = A\bar{B} + \bar{A}B$

LOGIC
$S = (\bar{A}\bar{B})(\bar{\bar{A}}\bar{\bar{B}}) = \overline{AB + \bar{A}\bar{B}} = A\bar{B} + \bar{A}B$ LOGIC
$\bar{X} = Y + \bar{A}\bar{C}$
$\bar{Y} = X + \bar{B}\bar{C}$ INVENTOR.
JAMES L. BUIE,
BY HIS ATTORNEYS
Spensley & Horn.

JAMES L. BUIE,
INVENTOR.

BY HIS ATTORNEYS
Spensley & Horn 3,283,170

COUPLING TRANSISTOR LOGIC AND OTHER CIRCUITS

James L. Buie, Panorama City, Calif., assignor to TRW Semiconductors, Inc., Los Angeles, Calif., a corporation of Delaware Filed Sept. 8, 1961, Ser. No. 136,841
28 Claims. (Cl. 307—88.5)

This invention relates to transistor circuits and more particularly to novel means for providing coupling between transistor stages.

Prior art methods of performing the coupling function between input and output transistor stages include direct coupling, diode coupling, resistor coupling, and resistor-capacitor coupling. The prior art coupling techniques each have attendent disadvantages. Direct coupling does not allow for proper isolation of the driven or output transistors so that the transistor having the lowest base-to-emitter saturation voltage will take most of the available current. On the other hand, by the use of a coupling transistor, each driven stage, is isolated from the driver stage during the "on" condition for the output stage.

If diode coupling were to be used by using two back-to-back diodes so that they act in a manner very similar to the way thte coupling transistor is used in accordance with the present invention, "faults" may cause improper operation as will be more fully explained hereinafter.

Resistor coupling severly limits the switching speed of the circuit and therefore is not desirable in high speed computer application.

One of the prime requisites required of a coupling device is that said device does not introduce appreciable delay in the switching action from input to output. When diodes are used for coupling, these diodes are often expensive since selected or carefully processed devices are required in order to have very short recovery time. Short recovery time is tantamount to short delay in the switching circuit. On the other hand, storage time of the coupling transistor (a term used for transistors which is similar in effect to the recovery time of the diode), is not an important characteristic when the transistor is used as the coupling means as herein described. The reason for this result is that there is no cessation and accumulation of appreciable minority carrier total charge in the transistor as a result of switching. Such is not the case for the diode or diodes when used as a coupler.

The coupling transistor is always retained in the saturated mode, regardless of whether the base current is passed to the emitter or to the collector. Therefore, the base is always forward biased with respect to the collector and minority carriers present in the collector region have nearly constant total charge. At most, a relatively slight adjustment of the minority carrier charge distribution occurs in the base and collector region during switching. Although it is difficult to affirm the foregoing hypothesis by measurement, measured delay times using silicon NPN transistors in coupling circuits have shown typical delays of less than one nanosecond. These same transistors have storage times measured separately of approximately 20 nanoseconds. On the other hand, using diodes having two nanosecond recovery time, switching delays of comparable value are measured.

The use of resistor-capacitor coupling, while better than resistors alone from the point of view of switching speed, is still typically slower than that obtained by coupling transistors in accordance with this invention. Further, resistor-capacitor coupling does not tolerate faults as discussed in connection with the diode coupling method. Also, unnecessary power loss occurs in the resistive elements.

All of the prior art methods above described require separate load impedances for the output stage and are therefore uneconomical in number of parts required. When multiple coupling is required, all of the prior art methods require many times more parts or circuit components than does the present invention approach. Circuits employing coupling transistors intermediate between an input stage and an output transistor stage overcomes all of the disadvantages attendent with the techniques hereinabove described.

The present invention coupling transistor approach is particularly suited to the newly developing integrated circuit design in the semiconductor industry. As compared with other devices, semiconductor manufacturers typically have a relatively low yield as the processes for producing semiconductor devices have critical acceptance parameters which are difficult to control. The present invention presents a technique for effectively increasing the "yield" by a novel circuit approach; one which is particularly suited to integrated circuits. By organizing the fabrication of multiple devices into circuit functions employing transistor coupling, wide tolerances upon the individual devices are permissible. Thus, yield is increased by redefining the acceptance criteria.

The present invention further provides a novel construction of a transistor particularly suited for the coupling function as herein described. This construction is also extremely well suited to fabrication on a single silicon substrate with other transistors and resistors, etc. to form integrated circuits to perform various extensively versatile logic functions.

In addition, the present invention integrated circuit design, by a novel approach, permits overlapping metallized connector stripes which are electrically insulated from one another.

The above discussion was chiefly concerned with how one switch is electrically connected to another switch. The simplest type of coupling is a direct conductor. When this is used in a circuit, it is said to employ direct-coupled-transistor-logic abbreviated DCTL. This circuit approach was developed in the early days of the germanium transistor and was largely rejected by circuit people, as somewhat closer control of transistor parameters was required than could then be economically achieved. Silicon transistors, because of the greater "on" and "off" voltages and also because of the closer control of parameters through improved manufacturing techniques (diffusion) have recently revived interest in DCTL. While it is possible to secure manufacturing control sufficient to employ DCTL, it can only be done, at present, at a great expense in yield of integrated circuits. In the logic circuits under consideration, the critical transistor characteristic is the base to emitter turn-on voltage $V_{BE}$ (sat.).

Switching circuits are of two general types, saturating and non-saturating. Saturation refers to operating the transistor in the high-current, low-voltage region of its collector characteristics. Non-saturation refers to external circuitry which prevents operation in this region. The difference between the two modes of operation, heretofore, has been an order of magnitude slower switch recycling time for saturation circuits compared to the non-saturating type. However, recent development of certain transistor types employing gold doping in the collector region has reduced both the time to establish saturation and the time to come out of it (the latter commonly called storage time), thereby making saturated switching circuits more attractive. Although slightly slower than non-saturating switches, the difference is markedly reduced, so that the complex external circuitry required for non-saturation may no longer be justifiable.

The transistor coupled transistor logic, i.e., TCTL, concept as opposed to DCTL permits greater freedom to the circuit designer in several aspects. For example, the DCTL approach requires that all of the emitters of the transistors in any given portion of a circuit be at a common potential. The TCTL approach, on the other hand, presents no such limitation. While it is true that the same circuit function could be achieved by DCTL despite their common emitter requirement, such can only be achieved by using more complex circuitry serving to increase cost and to reduce reliability.

Other advantages of TCTL are the following. It eliminates "current hogging" properties of DCTL which would otherwise require especially close tolerance in manufacture. It has been suggested for DCTL that if the base input characteristics were to be made closely uniform and if the base input resistance were to be increased moderately, then the disparity in input currents would be greatly reduced. This, however, sacrifices frequency performance and switching speed.

As will be discussed hereinbelow, tolerance of faults arising in the device or externally generated, can be tolerated by TCTL. Circuits have been tested by the applicant allowing 1000 ohm resistors to be connected indiscriminately from one terminal to another without causing the circuit function to fail; thus, the circuit reliability is greatly increased.

Further, TCTL allows level shifting so that integrated circuits employing this arrangement may drive not only other TCTL circuits, but, at the same time, drive circuits requiring somewhat different voltage levels. A typical case may be where an output transistor drives a TCTL module requiring approximately 0.2 and 0.8 volt logic levels while from the same terminal provide 0.2 and 5.0 volts logic level to another circuit.

It is therefore an object of the present invention to provide an improved transistor coupling circuit.

Another object of the present invention is to provide a fast switching means for coupling switching transistors.

Yet another object of the present invention is to provide a practical means for coupling switching transistors in integrated circuits.

A still further object of the present invention is to provide a transistor as the coupling means between two transistor stages in which the coupling means may also perform a logic function.

Yet another object of the present invention is to provide an improved coupling means between input and output transistor stages which requires a minimum number of circuit components and therefore produces increased reliability and lower cost.

Yet a further object of the present invention is to provide a novel means for interconnecting various circuit elements in a single integrated circuit substrate which permits overlying connectors which are electrically insulated one from the other.

In accordance with the presently preferred embodiment of the present invention, there is provided a coupling transistor of the same type as that of an input transistor and an output transistor which is connected in a particular manner. That is, all of the transistors should either be of the NPN type or of the PNP type. The manner of interconnection of the transistors is as follows. If the transistors are NPN type, then the base of the coupling transistor is connected to a source of potential +B. The emitter of the input and output transistors are connected to a source of potential which is below that of that voltage presented by the +B voltage source at the base of the coupling transistor, preferably at ground potential. Further, the coupling transistor has its emitter electrode connected to the collector electrode of the input transistor and its collector electrode connected to base electrode of the output transistor.

The novel features which are characteristic of the present invention, both as to its organization and method of operation, together with further objects and advantages thereof, will be metter understood from the following description considered in connection with the accompanying drawings in which a presently preferred embodiment of the invention is illustrated by way of example. It is to be expressly understood, however, that the drawings are for the purpose of illustration and description only, and are not intended as a definition of the limits of the invention.

Figure 1:
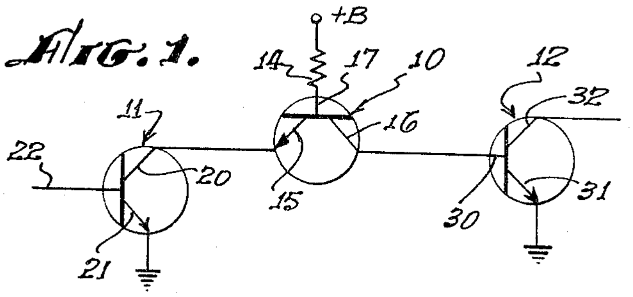
FIGURE 1 is a schematic view of an NPN coupling transistor connected intermediate two NPN transistor stages in accordance with the presently preferred embodiment of this invention.

Referring now to the drawings and more particularly to FIGURE 1, there is shown a coupling transistor 10 which is of the NPN type, coupled intermediate an input transistor 11 and an output transistor 12, both of which are also of the NPN type. The emitter electrode 15 of coupling transistor 10 is connected to the collector electrode 20 of transistor 11 while the collector electrode 16 of the coupling transistor 10 is connected to the base electrode 30 of the output transistor 12. The emitter electrode 21 and 31 of transistors 11 and 12 are both connected to ground. The base electrode 17 of coupling transistor 10 is connected to a source of positive potential +B through resistor 14. Resistor 14 in combination with the supply voltage acts as a substantially constant circuit source for the base electrode 17 of the coupling transistor 10.

The operation of the coupling transistor circuit shown in FIGURE 1 is as follows: Assume that a signal is received at the base electrode 22 of input transistor 11 thus turning this transistor "on." The collector to emitter voltage of this transistor will be at its saturation value which we will asume to be approximately 0.2 volt. Current from the supply source +B will flow through resistor 14 and the forward biased base-emitter junction of the coupling transistor 10 to the collector electrode 20 of input transistor 11 and then through transistor 11 to ground.

The emitter 15 of the coupling transistor 10 will therefore be at a potential above ground. Thus, the coupling transistor 10 may be considered turned "on" or saturated as it is conducting heavy current from base to emitter. The collector to emitter voltage of the coupling transistor is therefore very low, a typical value being 0.1 volt or less, this voltage being designated $V_1$ where:

$$V_1 = KT/q \ln B/B_1$$

where $Kt/q = 0.026$ volt $B$=forward grounded emitter current transfer ratio $B_1$=reverse grounded emitter current transformer ratio Therefore, the collector to ground voltage of the coupling transistor 10 is approximately $V_{CE}$ $$(\text{sat.}) + V_1 = 0.3 \text{ v.}$$

if the output stage, i.e., transistor 12 is not providing current. If a "fault" were to occur on the base of output transistor 12 resulting in the supply of a substantial current to the coupling transistor 10 (e.g. in the amount approximating the total current supplied to the input stage, transistor 11), then the collector to ground voltage of the coupling transistor 10 would rise to only approximately 2 $V_{CE}$ (sat.) or 0.4 volt. The output stage, transistor 12, will remain "off" as the voltage required for transistor operation from base to ground is approximately $V_{BE}$ (sat.) or 0.75 volt. It will therefore be seen that the coupling transistor has provided a low impedance path from the collector 20 of the input stage to the base 30 of the output stage. Thus, for this period of operation the coupling transistor acts as a direct conductor between the two stages which is a desirable type of connection.

Operation of the coupling transistor for the case where the input stage is not conducting will now be considered. As the input stage is "off" current does not flow out of the emitter 15 of the coupling transistor 10; therefore the base voltage rises toward +B. When the base voltage rises to $V_{BE}$ sat. or approximately 0.7 volt, current flows from +B through resistor 14 and the forward biased base-collector of the coupling transistor to the base 30 of output stage 12 thus turning this transistor "on."

The following discussion will indicate that faults present on the input or output stage can be tolerated by the novel circuit arrangement of the present invention utilizing the coupling transistor.

For the purpose of this description the word fault is intended to mean a leakage path; it may be caused by an internal or external impedance not designed into the circuit, but which may inadvertently be present.

The degree of fault which may be tolerated by the present invention circuit using transistor coupling between input and output stages depends upon the type of transistor which is used for coupling. That is, it depends on whether the transistor has a high or low inverse beta. It also depends upon the value of the supply voltage and the value of the resistor between the voltage supply and the base of the coupling transistor. More specifically, a fault of a value greater than R or equal to that of the resistor 14 from, for example, the base 30 of the output stage to ground may be tolerated. In the case where the output transistor 12 is off, we wish it to remain off even in the presence of a fault resistance path. Clearly in this case, if the value of the fault were to approach zero, i.e., almost present a short circuit to ground then the transistor most certainly would remain off as this path would have a low impedance to the flow of current from +B, hence thus there would be insufficient potential to turn the transistor on. As the value of R increases toward infinity, certainly the circuit operation would be unaffected as this approaches the ideal case, i.e., no leakage path at all. It therefore is readily apparent that from the case where the transistor 12 is off we wish it to remain of any value of fault from the case under consideration can be tolerated.

In the case where transistor 12 is on, however, it turns out that the leakage must be greater than or equal to the value R (i.e., the resistance 14). Again in this situation it is clear that if R approaches infinity the circuit operation will be unaffected as it is as if it didn't exist. But as the fault resistance approaches R going toward zero, we must be concerned that at least a certain voltage be maintained at the base of transistor 12, else it will turn off. If we assume that it requires at least 0.75 volt at this point to keep the transistor on and that the value of +B is fixed, and that the internal voltage drop of the base-collector diode of transistor 10 is 0.7 volt then the fault resistance from base to ground of transistor 12 must be at least equal to R. It would follow in this example that +B must be at least 2 (.75)+.7=2.2 volts. A typical value for R, i.e., resistor 14 is 1000Ω; therefore the fault resistance for all cases between base and ground of the output stage may vary from 1000Ω to infinity for the circuit to be able to tolerate the same, a considerable range. It would therefore follow that if R were 100Ω that the full range could be from approximately 100Ω to infinity.

Similarly, a fault of a value greater than or equal to R can be tolerated from the base 30 of output stage 12 to the collector 32 of stage 12. It will first be assumed that the collector 32 of the output stage 12 terminates in another coupling transistor similar to transistor 10. Thus, the output transistor may try to go on from an off state because of the +B source of this second coupling transistor. This will not occur, however, as the coupling transistor 10 acts as a low impedance to the input transistor 11 which offers a low impedance to ground as the collector and emitter of the coupling transistor are nearly at the same potential, typically varying by an amount of approximately 0.1 volt. It can similarly be shown that a fault of value greater than or equal to R can be tolerated from the collector 20 of the input stage 11 to ground. That is, if the input transistor is on and a fault resistance is viewed as being placed across from collector 20 to ground, the operation is esentially unaffected as the transistor offers a lower impedance path to ground than does the fault resistance. If, on the other hand, transistor 11 is off, it can be seen that the voltage at the collector of the coupling transistor is slightly higher than that of the emitter. It is at the required 0.75 volt to turn the output transistor on. The output transistor remains on in the presence of a resistance across the input transistor as .75 volt will still appear across the base to emitter of the output stage even though there may be as much as .65 volt across the resistance from the collector 20 of the input transistor to ground. This assumes an 0.7 volt drop between the base to collector of the coupling transistor and a .8 volt drop between the base and emitter of the coupling transistor 10. Here it further is seen that the +B voltage is approximately 2.2 volts; therefore, there will only be .65 volt across the fault resistance under consideration. It is assumed throughout that only a small base current, substantially less than the supply current is required to turn transistor 12 on.

From the above it is clear that the coupling transistor in accordance with the present invention offers all of the advantages of direct coupling; namely, presenting a low impedance path when desired, but at the same time can tolerate faults and therefore permits greater flexibility in the transistors into which it is connected as in to several output transistors which is typical in computor circuits. This will be further expanded upon hereinafter.

Figure 2:
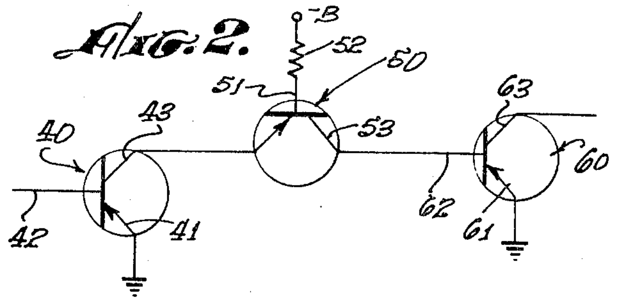
FIGURE 2 shows a circuit similar to that of FIGURE 1 employing PNP transistors.

In FIGURE 2 there is shown a circuit similar in most respects to that of FIGURE 1 with the following exceptions: Each of the three transistors including input transistor 40, coupling transistor 50, and output transistor 60, are interconnected in the same manner as shown in FIG- URE 1. It will be noted, however, that herein all three transistors are of the PNP type while those in FIGURE 1 are all of the NPN type. Thus, the base electrode 51 of the coupling transistor is connected through resistor 52 to a negative biasing source —B, and with the emitters 41 and 61 connected to ground they will be at a higher potential than —B.

It is therefore apparent that the absolute value of the supply voltage need be greater than the turn-on voltage of the coupling transistor and that of the output transistor. If the transistors are all of the NPN type and the emitter of the output transistor is grounded, then in this case, for example, the supply voltage need be positive and greater than the sum of the base to collector saturation voltage of the coupling transistor and the base to emitter saturation voltage of the output transistor.

All of the discussion hereinabove described in the operation and advantage of the circuit of FIGURE 1 are applicable to FIGURE 2, the only difference being that herein all of the transistors are of a PNP type rather than the NPN type and therefore there is a negative supply voltage rather than a supply voltage. It will be noted in both instances, however, that there is required a load or current limiting resistor 52 between the supply voltage and the base 51 of a coupling transistor 52 between the supply voltage and the base 51 of a coupling transistor and in both instances all of the transistors; that is, the input and output transistors mut be of the same conductivity type as the coupling transistor. That is, they must all be of NPN type or of the PNP type in order for the circuit to be practically operable.

Figure 3:
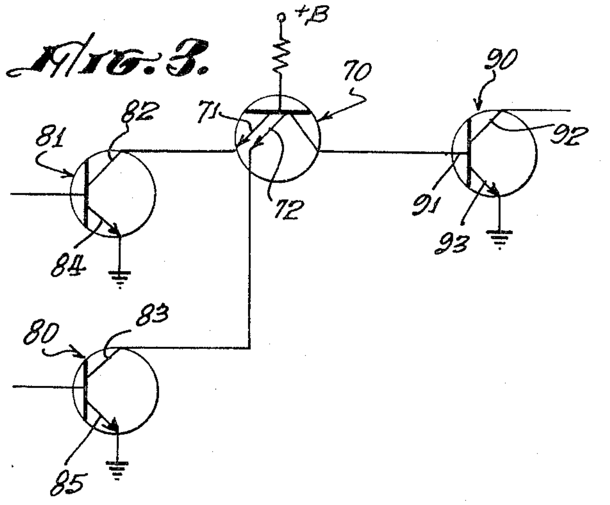
FIGURE 3 is a circuit similar to FIGURE 1 except that two emitter regions are provided on the coupling transistor for accommodation of two input transistors.

In FIGURE 3 there is shown a circuit similar to FIGURE 1 employing all NPN transistors. Herein, the coupling transistor 70 includes two emitters rather than one, they being numbered 71 and 72.

In this circuit the emitter electrode 71 of the coupling transistor 70 is connected to the collector electrode 82 of the first input transistor 81, while the emitter electrode 72 is connected to the collector electrode 83 of the second input transistor 80. Both of the input transistors have their emitter electrodes 84 and 85 connected to ground. The input signals are received at base electrodes 86 and 87 of the input transistors which transistors are coupled to the output transistors 90 by the coupling transistor 70. The output signal from this circuit is generated at the collector electrode 92 of transistor 90. The output transistor 90 has its emitter electrode 93 connected to ground. This circuit is in all respects the same as that of FIGURE 1 except for the inclusion of the second emitter electrode 72 which is connected to a second input transistor 80 which is also of the NPN type. In operation, the multi-emitter coupling transistor circuit of FIGURE 3 is such that the input stage which is on will control the operation. That is, not all of the input transistors need be on. Input transistors 81 may be off while input transistor 80 may be on or vice-versa. In this multiple emitter circuit in a case where there is an off input stage, it will not draw current and the emitter of the coupling transistor which is connected to this off stage may be at any positive potential short of breakdown voltage of the emitter-base junction of the off input transistor.

Two general cases need to be discussed. When both input transistors are off, the coupling transistor 70 supplies current to turn the output transistor on. When either or both input transistors 80 and 81 are on, the coupling transistor supplies current to the on input transistor or transistors (there may be more than two inputs in the general case) and presents a potential to the base 91 of the output transistor less than that required to turn it on or maintain it on. Therefore, in the second general case, the output transistor is off.

One of the prime virtues of the coupling transistor is the elimination of circuit malfunction due to an effect described as "current hogging." In the previous discussion, it was shown that faults could be tolerated in much the same manner as direct coupling DCTL. But in the case where one input transistor is connected to drive more than one output transistor, the direct connection of the DCTL method may only supply appreciable base current to one output transistor unless both output transistors are matched in regard to emitter-base voltage-current characteristic. This emitter-base characteristic in terms of voltage at a specified current is called $V_{BE}$ (sat.).

Figure 4:
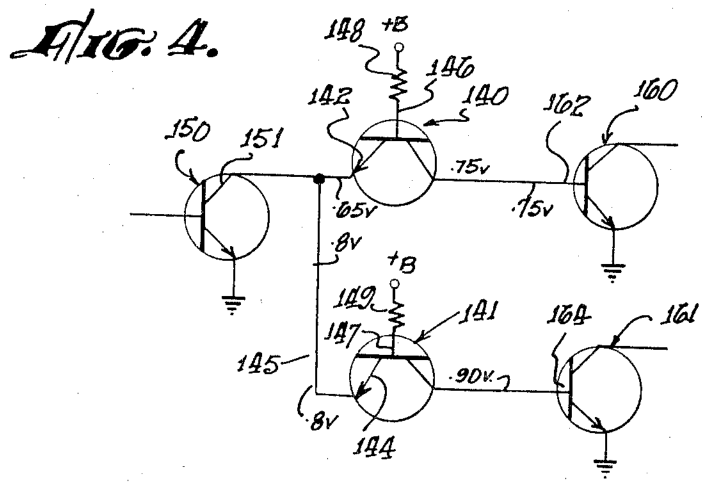
FIGURE 4 shows a circuit employing two coupling transistors for coupling one input transistor to two output transistors.

Reference is now made to FIGURE 4 wherein there is shown a circuit employing two NPN coupling transistors 140 and 141 to effectively isolate and interconnect NPN input transistors 150 to two NPN output transistors 160 and 161. The emitter electrodes 142 and 144 of the two coupling transistors 140 and 141 are interconnected through conductor 145. Each of the base electrodes 146 and 147 of these two transistors are connected to a source of +B through resistors 148 and 149. The collector electrodes 152 and 153 are each connected to the base electrodes 162 and 164 of the two output transistors 160 and 161.

If it is assumed that the two output transistors 160 and 161 are not matched, it requiring 0.75 volt from base to emitter of transistor 160 to turn it on while it requires .90 volt from base to emitter to turn transistor 161 on. Absent the two coupling transistors 140 and 141, the bases would be directly connected to the collector 151 of the input transistor 150. Under these circumstances, transistor 161 would never get turned on, for when a voltage of .75 is established at the collector of transistor 150, transistor 160 would draw substantially all of the current and the minimum required turn-on voltage of .9 volt for transistor 161 would not be reached.

By employing the two coupling transistors 140 and 141, isolation between the collector of the input transistor 150 and the bases of the output transistor is achieved with the voltages at the points of interest being as indicated in the drawing; for example, while .65 volt only is required at the emitter 142 of input transistor 140, the establishment of .8 volt would serve merely to back bias the emitter to base diode of transistor 140 but current from +B through resistor 148 through the base to collector diode of this transistor would still be sufficient to turn transistor 160 on. The foregoing is true if the coupling transistors have a low inverse current gain which is generally true for a large class of silicon switching transistors such as, for example, the 2N706.

Figure 5:
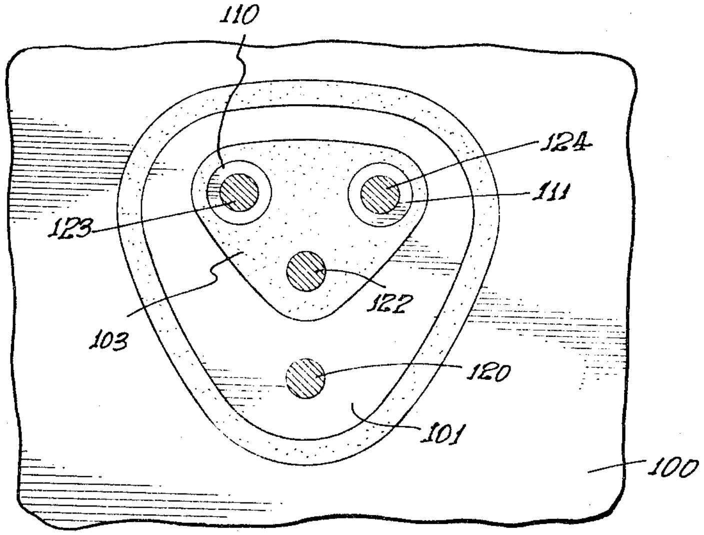
FIGURE 5 is a plan view of a portion of an integrated circuit formed on a single silicon substrate showing the presently preferred embodiment of a multiple emitter coupling transistor in accordance with the present invention.
Figure 6:
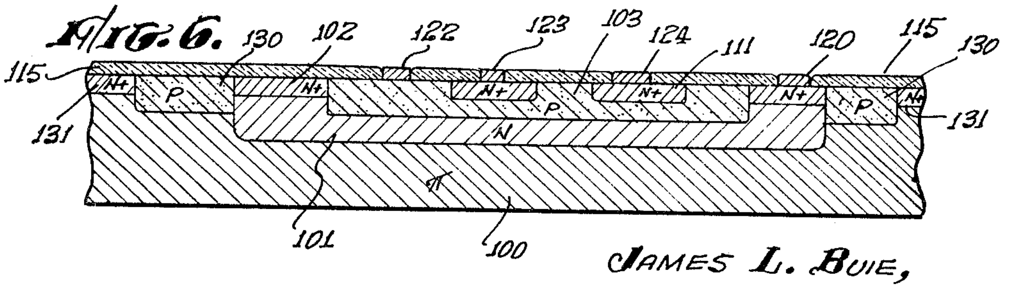
FIGURE 6 is a front elevation in section of the substrate of FIGURE 5.

In FIGURES 5 and 6 there is a plan view and a schematic front elevation somewhat enlarged showing the presently preferred construction of an NPN multiple emitter coupling transistor formed in a portion of an integrated circuit substrate particularly suited for the present invention.

Viewing FIGURE 6, there may be seen a parent silicon crystal 100 which is of high resistivity P type silicon, e.g., of the order of from 10 ohm-cm. to $200 \times 10^3$ ohm-cm. Centrally located within the parent crystal 100 is N region 101 which is preferably greater than 0.04 ohm-cm. This region serves as the collector of the coupling transistor. The collector region 101 extends upwardly very close to the upper surface of the parent crystal. Contiguous with the collector region is annulus shaped collector contact region 102 which is of $N^+$ conductivity. Region 102 extends to the upper surface of the parent crystal. Centrally disposed within the collector region 101 is base region 103 which is of P type conductivity.

The emitter regions 110 and 111 of $N^+$ conductivity extend into the upper surface of the base region 103. An oxide layer 115 extends over the entire upper surface of the crystal 100. This oxide layer has several openings provided therethrough in order to permit metalized contacts to be made to all of the regions above mentioned. The collector contact is designated 120, the base contact 122 and the emitter contacts 123 and 124.

The P and $N^+$ regions at opposite ends of the crystal although not strictly required are advantageous in several respects. No electrical contact is made to these regions and they form no part of the active portions of the transistor. However, the stability of the collector junction in regard to environmental stress is improved by the use of the P region 10. The use of the heavily doped P region provides a measure of protection against inversion channels that might otherwise form over this surface and thereby promote leakage paths. That is, in lieu of the P region 130, the $\pi$ region 100 would otherwise terminate the collector region 101 at the surface and provide a design which could lead to the possibility of high leakage current, therefore, the P region 130 need be adjacent region 101, i.e., this region 130 or its equivalent should either be abutting the collector region 101 or be close thereto.

The $N^+$ region 131 outside the P region although not strictly required is often desired as a means to achieve electrical isolation of several such transistors that may be fabricated in close proximity. The $N^+$ regions extending over most of the surface of the substrate material increases the conductivity of the parent material and acts as a grounding plane. The $N^+$ region would be shorted to the $\pi$ region in several places (not shown) so that both the outer $N^+$ regions and the $\pi$ would be essentially at the same potential. Further, the $N^+$ region 131 need not be adjacent the P region 130.

Typical values for the various parameters of the coupling transistor of FIGURES 5 and 6 are as follows:

| | | |
|---|---|---|
| Length of structure | mils | 20 |
| Height of structure | do | 5 |
| Depth of collector region | microns | 9 |
| Depth of base region | do | 3 |
| Depth of emitter region | do | 2 |
| Depth of P region 130 | do | 3 |
| Depth of $N^+$ region 131 | do | 2 |
| (All depths are measured from upper surface) | | |
| Oxide thickness | micron | 1 |
| Collector sheet resistance | ohms/sq | 50 |
| Base sheet resistance | do | 150 |
| Emitter sheet resistance | do | 3 |

Figure 11:
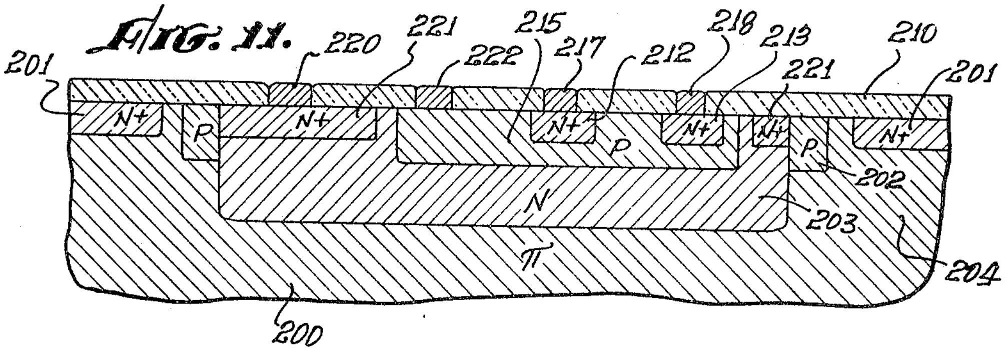
FIGURE 11 is a cross-sectional view of an alternate embodiment of a coupling transistor on a portion of a substrate of a parent semiconductor crystal body.

In FIGURE 11, there is shown a portion of a silicon substrate 200 including an NPN double emitter coupling transistor in with the surrounding $N^+$ region 201 is spaced from the region 202 which surrounds the collector region 203 so that the high resistivity $\pi$ region 20 of the parent crystal extends to the upper surface just below the oxide 210 which serves to passivate all of the junctions. The two emitter regions 212 and 213 are disposed within the base region 215 and have metal low resistance ohmic contacts 217 and 218. The collector ohmic contact 220 is made to low resistivity $N^+$ region 221. The base contact is numbered 222. The oxide coating 210 covers the entire upper surface of the substrate except over the areas occupied by the contacts. The oxide and the contacts can be produced by any method known to the art.

Note that in this structure, the collector low resistivity region 221 to which contact 220 is made, is separated from the base region 215 so that the N collector region 203 extends to the surface just below the oxide 210. Thus, this structure is the substantial electrical equivalent of the FIGURES 5 and 6 structure described above. It differs in two respects. The collector low resistivity region 221 is spaced from the isolated base region 215 in order to increase the collector to base breakdown voltage. The spacing between the surrounding $N^+$ region 201 and surrounding P region 202 serves to increase the substrate to collector breakdown voltage.

Figures 12, 12A:
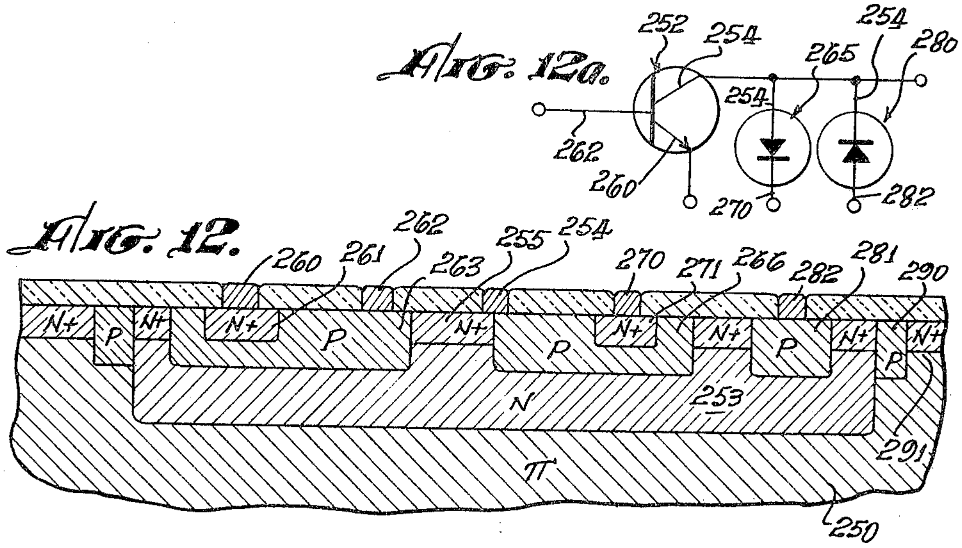
FIGURE 12 is a cross-sectional view of a complete integrated circuit on a semiconductor substrate.
FIGURE 12A is a circuit diagram representation of the equivalent circuit of the integrated circuit of FIGURE 12.

In FIGURE 12, there is shown another substrate 250 of high resistivity P type silicon including one transistor and two diodes connected as shown schematically in FIGURE 12*a*. The transistor 252 of FIGURE 12*a* consists of collector 253 contact to which is made by contact 254 through $N^+$ region 255.

The emitter contact 260 is made to the emitter $N^+$ region 261. The base contact 262 of the transistor is made to the base region 263. Dioded 265 has its P region 266 connected to the collector of the transistor 252 by means of shorting contact 254. The other end of diode 265 terminates in contact 270 which is in ohmic contact with $N^+$ region 271 of the diode 265. The P region 281 of diode 280 terminates in contact 282 while the N region of this diode is common with the collector region 253 of the transistor; thus, the circuit of FIGURE 12A. Finally the entire circuit is surrounded by adjacent regions 290 which in turn is surrounded by $N^+$ region 291. These surrounding regions serve the same function as regions 130 and 131 of FIGURE 6.

Figure 13:
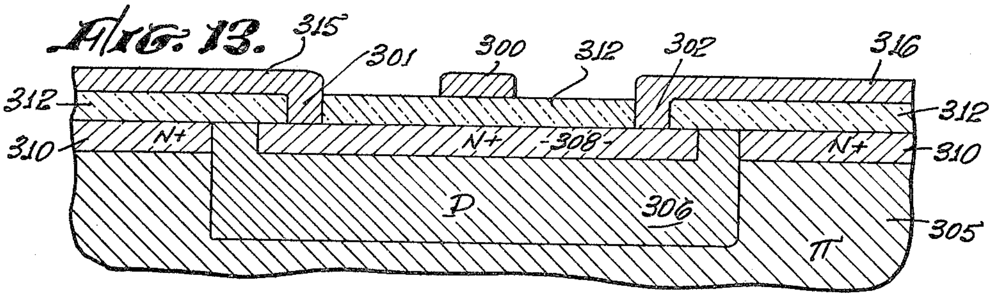
FIGURE 13 is a cross-sectional view showing how an overlying interconnection between equivalent circuit elements is achieved in an integrated circuit without shunting the two connectors.

In FIGURE 13, there is illustrated a technique for providing an effective connection cross-over between circuit elements in a single substrate without electrical shorting therebetween.

That is, it is assumed that electrical leads to different portions of an integrated circuit require leads to cross-over one another without producing an electrical short circuit between them. Thus, it is assumed that it is desired to have a connection 300 which is going into the plane of the drawing while connection is made through connector 301 from a point not shown to connector 302 to another point not shown.

A portion of a substrate 305 of high resistivity material designated $\pi$ is assumed to be a portion of a larger integrated circuit. Within the substrate 305 is a diffused P type region 306 whose resistivity is approximately 150 ohms/sq. This region extends to a depth of approximately 3 microns into the crystal from the upper surface. It would typically be formed during the base diffusion of a transistor as discussed in connection with FIGURE 11. Centrally disposed within region 306 is a low resistivity region 308 which is completely surrounded by region 306. Region 308 is of $N^+$ conductivity and extends to a depth of approximately 2 microns into the upper surface of the substrate. The resistivity of region 308 is very low, i.e. of the order of 3 ohms per square. A typical length for this $N^+$ region is 4½ mils and its resistance between contacts 301 and 302 is 3 ohms. Surounding P region 306 is $N^+$ region 310 which extends to approximately the same depth as region 308. The function of region 310 is the same as that of region 131 in FIGURE 6. Covering the upper surface of the substrate is an oxide coating 312. Thus, contact 300 is insulated from region 308. Region 308 together with contacts 301 and 302 serve as a connector to other regions, preferably by means of metalized coatings 315 and 316 over the surface of the oxide.

Figure 7:
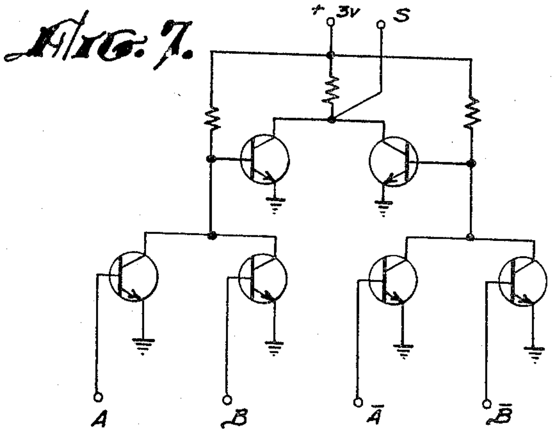
FIGURE 7 is a circuit diagram of a transistor circuit adapted to perform the indicated logic using DCTL.
Figure 8:
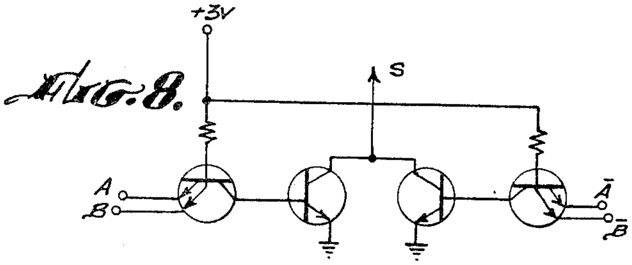
FIGURE 8 is a circuit diagram of a transistor circuit for performing the same logic as the FIGURE 7 circuit using TCTL.

The circuit of FIGURE 7 performs the indicated logic operation in the conventional manner using direct coupling. Note that this circuit requires six transistors, and three resistors, while the circuit of FIGURE 8 using transistor coupling performs essentially the same circuit function using but four transistors (two of the multiple emitter type as hereinbefore described) and but two resistors. Thus, six rather than nine circuit elements are required. Further, fewer internal lead connections are required. Both of the circuits shown in FIGURES 7 and 8 are "exclusive OR" circuits. The propagation time of the TCTL circuit is approximately 10 nanoseconds while that for FIGURE 7 is approximately twice as long or 20 nanoseconds.

Figure 9:
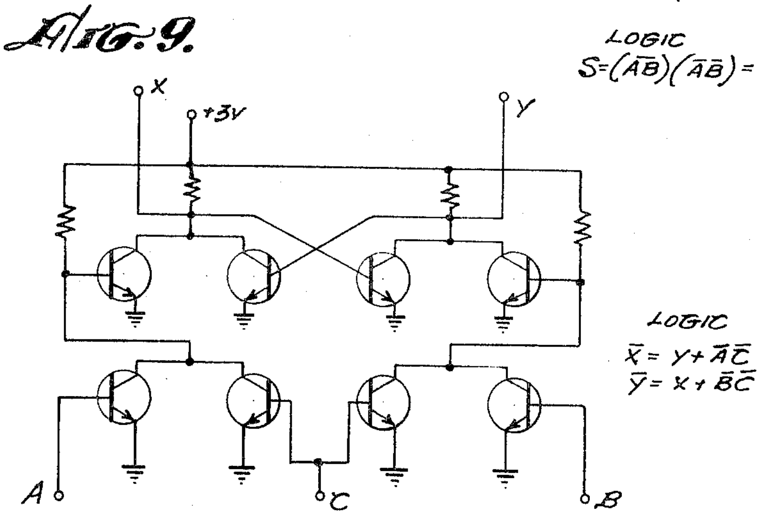
FIGURE 9 is a circuit diagram of a transistor circuit adapted to perform the different indicated logic using DCTL.
Figure 10:
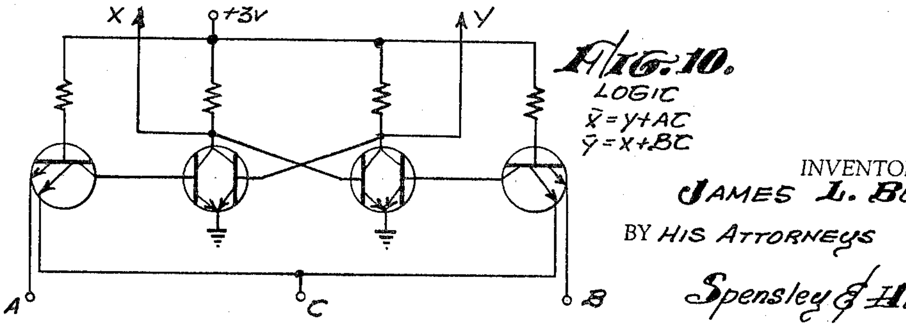
FIGURE 10 is a circuit diagram of a transistor circuit for performing logic nearly the same as the FIGURE 9 circuit but using TCTL.

The circuit of FIGURE 9 is a set-reset flip-flop circuit complete with gating means. This circuit employs DCTL logic; and as can be seen from the drawing it requires 8 transistors and 4 resistors in order to carry out the indicated logic function. The propagation of this circuit is approximately 20 nanoseconds. The circuit of FIGURE 10, on the other hand, exemplifies the use of TCTL in accordance with the present invention. It requires but six transistors (two sets of grounded emitter transistors whose collectors are connected to +3 volts and shown in one envelope) and 4 resistors. More importantly, the propagation time of this circuit is but approximately 10 nanoseconds. It should be noted that two of the transistors in this circuit include two emitters in accordance with the FIGURES 5 and 6 construction described above. A careful study of the circuit of FIGURE 10 shows that its logic is slightly different than that of FIGURE 9. That is, instead of the term $\overline{AC}$ and $\overline{BC}$ as is found in the FIGURE 9 circuit, the FIGURE 10 output indicates the converse, i.e. AC and BC where indicated. This is considered a trivial difference.

There has thus been described an improved circuit design employing transistor coupling and specific and novel means for constructing. A coupling transistor in accordance with the invention has been described where only one input transistor is used, the coupling transistor requires but one emitter if it is connected in the mode as shown in FIGURE 1. Two or more emitters may be required for circuits as shown in FIGURES 4, 8 and 10. A convenient and novel construction for a two emitter NPN transistor is shown in FIGURES 6 and 11.

There has further been shown several novel designs of coupling transistors particularly suited for carrying out the stated circuit function.

Finally, there has been shown a novel means for construction or an integrated circuit substrate overlying leads without shorting between them.

What is claimed as new is:

1. A semiconductor device comprising a body of semiconductor material, said body being of high resistivity material, said body containing a first region of a predetermined conductivity type disposed within and terminating in a first surface of said body; a second region disposed within said first region and terminating in said first surface, said second region being of the opposite conductivity type from that of said first region; a third region surrounding and adjacent to said first region, said third region terminating in said first surface and being of the opposite conductivity type from that of said first region; a fourth region surrounding said third region and being of the opposite conductivity type from that of said third region and terminating in said first surface; and low resistance ohmic contacts to at least one of said first and second regions.

2. A semiconductor device comprising a body of semiconductor material, said body being of high resistivity material, said body containing a first region of a predetermined conductivity type disposed within and terminating in a first surface of said body; a second region disposed within said first region and terminating in said first surface, said second region being of the opposite conductivity type from that of said first region; a third region surrounding and adjacent to said first region, said third region terminating in said first surface and being of the opposite conductivity type from that of said first region; a fourth region being of the opposite conductivity type from that of said third region, said fourth region being adjacent to and surrounding said third region and terminating in said first surface; and low resistance ohmic contacts to at least one of said first and second regions.

3. A semiconductor device comprising a body of semiconductor material, said body being of high resistivity material, said body containing a first region of a predetermined conductivity type disposed within and terminating in a first surface of said body; a second region disposed within said first region and terminating in said first surface, a third region surrounding and adjacent to said first region, said third region terminating in said first surface and being of the same conductivity type as that of said second region, said third region extending from said first surface into said body to a distance substantially the same as that of said second region; a fourth region surrounding said third region, said fourth region being of the same conductivity type as that of said first region and terminating in said first surface, said fourth region extending to a depth from said first surface into said body which is less than the depth of said third region; and a low resistance ohmic contact to at least one of said first and second regions.

4. A semiconductor device comprising a body of semiconductor material, said body being of high resistivity material, said body containing a first region of a predetermined conductivity type disposed within and terminating in a first surface of said body; a second region disposed within said first region and terminating in said first surface, a third region surrounding and adjacent to said first region, said third region terminating in said first surface and being of the same conductivity type as that of said second region, said third region extending from said first surface into said body to a distance substantially the same as that of said second region; a fourth region surrounding said third region, said fourth region being of the same conductivity type as that of said first region but being of a lower resistivity than that of said first region, said fourth region surrounding said third region and terminating in said first surface, said fourth region extending to a depth from said first surface into said body which is less than the depth of said third region; and a low resistance ohmic contact to at least said second region.

5. A semiconductor device comprising a body of semiconductor material, said body being of high resistivity material, said body containing a first region of a predetermined conductivity type disposed within and terminating in a first surface of said body; a second region disposed within said first region and terminating in said first surface, said second region being of the opposite conductivity type from that of said first region; third and fourth spaced apart regions of the same conductivity type as that of same first region disposed within said second region and extending to said first surface; a fifth region surrounding and adjacent to said first region, said fifth region terminating in said first surface and being of the opposite conductivity type from that of said first region; a sixth region surrounding said fifth region, said sixth region being of the opposite conductivity type from that of the fifth region and terminating in said first surface; and low resistance ohmic contacts to said first, second, third and fourth regions.

6. A semiconductor device comprising a body of semiconductor material, said body being of high resistivity material, said body containing a first region of a predetermined conductivity type disposed within and terminating in a first surface of said body; a second region disposed within said first region and terminating in said first surface, said second region being of the opposite conductivity type from that of said first region; a third region of the same conductivity type from that of said second region surrounding and adjacent to said first region, said third region terminating in said first surface and extending to a depth within said body from said first surface which is substantially equal to the depth of said second region within said body; a fourth region surrounding said third region, said fourth region being of the opposite conductivity type from that of said third region and terminating in said first surface, said fourth region extending to a depth within said body which is less than that of the depth of said third region from said first surface; low resistance ohmic contact to said first and second regions; and an oxide coating over said first surface except in the area where said ohmic contacts are disposed.

7. A semiconductor device comprising a body of semiconductor material, said body being of high resistivity material, said body containing a first region of a predetermined conductivity type disposed within and terminating in a first surface of said body; a second region disposed within said first region and terminating in said first surface, said second region being of the opposite conductivity type from that of said first region; said second region being of a lower resistivity than the main portion thereof in the vicinity of said first surface, a third region of the opposite conductivity type from that of said first region surrounding and adjacent to said first region, said third region terminating in said first surface and extending to a depth within said body from said first surface which is substantially equal to the depth of said second region within said body; a fourth region surrounding said third region, said fourth region being of the opposite conductivity type from that of said third region but of lower resistivity and terminating in said first surface, said fourth region extending to a depth within said body which is less than that of the depth of said third region from said first surface; low resistance ohmic contacts to said first and second regions; and an oxide coating over said first surface except in the area where said ohmic contacts are disposed.

8. A semiconductor device comprising a body of semiconductor material, said body being of high resistivity material, said body containing a first region of a predetermined conductivity type disposed within and terminating in a first surface of said body; said first region being of a lower resistivity than the main portion thereof in the vicinity of said first surface, a second region disposed within said first region and terminating in said first surface, said second region being of the opposite conductivity type from that of said first region; third and fourth spaced apart regions of the same conductivity type as that of same first region disposed within said second region and extending to said first surface; said third and fourth regions being of a lower resistivity than that of said first region, a fifth region surrounding and adjacent to said first region, said fifth region terminating in said first surface and being of the opposite conductivity type from that of said first region; said fifth region extending into said body from said first surface a distance substantially equal to the depth of said second region, a sixth region surrounding said fifth region, said sixth region being of the same conductivity type and resistivity as that of said third and fourth regions and terminating in said first surface, said sixth region extending into said body from said first surface a distance which is less than the depth of said fifth region; and low resistance ohmic contacts to said first, second, third and fourth regions.

9. A semiconductor device comprising a body of semiconductor material, said body being of high resistivity material, said body containing a first region of a predetermined conductivity type disposed within and terminating in a first surface of said body; said first region being of a lower resistivity than the main portion thereof in the vicinity of said first surface, a second region disposed within said first region and terminating in said first surface, said second region being of the opposite conductivity type from that of said first region; third and fourth spaced apart regions of the same conductivity type as that of same first region disposed within said second region and extending to said first surface; said third and fourth regions being of a lower resistivity than that of said first region, a fifth region surrounding and adjacent to said first region, said fifth region terminating in said first surface and being of the opposite conductivity type from that of said first region; said fifth region extending into said body from said first surface a distance substantially equal to the depth of said second region, a sixth region surrounding said fifth region, said sixth region being of the same conductivity type and resistivity as that of said third and fourth regions and terminating in said first surface, said sixth region extending into said body from said first surface a distance which is less than the depth of said fifth region; low resistance ohmic contacts to said first, second, third and fourth regions; and an oxide coating over said first surface except in the area where said ohmic contacts are disposed.

10. A semiconductor device comprising a body of semiconductor material, said body being of high resistivity P type conductivity silicon, said body containing a first region of an N type conductivity disposed within and terminating in a first surface of said body; said first region being of a lower resistivity than the main portion thereof in the vicinity of said first surface, a second region disposed within said first region and terminating in said first surface, said second region being of P type conductivity; third and fourth spaced apart regions of $N^+$ conductivity type as that of same first region disposed within said second region and extending to said first surface; a fifth region surrounding and adjacent to said first region, said fifth region terminating in said first surface and being of the P type conductivity; said fifth region extending into said body from said first surface a distance substantially equal to the depth of said second region, a sixth region surrounding said fifth region, said sixth region being of the same conductivity type and resistivity as that of said third and fourth regions and terminating in said first surface, said sixth region extending into said body from said first surface a distance which is less than the depth of said fifth region; and low resistance ohmic contacts to said first, second, third and fourth regions; and an oxide coating over said first surface except in the area where said ohmic contacts are disposed.

11. A semiconductor device comprising a body of semiconductor material, said body being of high resistivity material, said body containing a first region of a predetermined conductivity type disposed within and terminating in a first surface of said body; said first region being of a lower resistivity than the main portion thereof in the vicinity of said first surface, a second region disposed within said first region and terminating in said first surface, said second region being of the opposite conductivity type from that of said first region and of a substantially lower resistivity than that of said first region, a third region surrounding and adjacent to said first region, said third region terminating in said first surface and being of the opposite conductivity type from that of said first region; said third region extending into said body from said first surface a distance substantially equal to the depth of said second region; spaced low resistance ohmic contacts to opposite ends of said second region; an oxide coating over said first surface except in the vicinity of said ohmic contacts; and a low resistance conductor disposed over said oxide coating intermediate said ohmic contacts extending at an angle with respect to said second region.

11. In a transistor circuit having at least one input transistor and at least one output transistor, each of said transistors having a base electrode, an emitter electrode and a collector electrode, said circuit including a coupling transistor having a base electrode, an emitter electrode and a collector electrode, each of said transistors being of the same type, said base electrode of said coupling transistor being coupled to a source of current, one of said electrodes other than the base electrode of said coupling transistor being connected to one of said electrodes other than the base electrode of said input transistor and the other of said emitter and collector electrodes of said coupling transistor being connected to the base electrode of said output transistor.

13. In a transistor circuit having at least one input transistor and one output transistor, each of said transistor having a base electrode, an emitter electrode and a collector electrode, said circuit including a coupling transistor having a base electrode, an emitter electrode and a collector electrode, each of said transistors being of the same type, said base electrode of said coupling transistor being coupled to a source of current to establish a predetermined voltage at a predetermined one of the electrodes other than the base electrode of said coupling transistor, one of the electrodes other than the base electrode of said coupling transistor being connected to a source which source produces a signal at either a first or a second predetermined level and the other of said emitter and collector electrode of said coupling transistor being connected to the base electrode of said output transistor, said predetermined voltage having an absolute value which is greater than the turn-on voltage of said output transistor.

14. In a transistor circuit having at least one input transistor and at least one output transistor, each of said transistors having a base electrode, an emitter electrode and a collector electrode, said circuit including a coupling transistor having a base electrode, an emitter electrode and a collector electrode, a source of E.M.F. and resistance means, said resistance means being connected intermediate said base electrode of said coupling transistor and said source of E.M.F., said source of E.M.F. serving to establish a voltage at the base electrode of said coupling transistor which is greater than the sum of the base-to-collector forward voltage drop of said coupling transistor and the base-to-emitter saturation voltage of said output transistor, the emitter electrode of said coupling transistor being connected to one of said electrodes other than the base electrode of said input transistor, and the collector electrode of said coupling transistor being connected to the base electrode of said output transistor, each of said transistor being of the same type.

15. In a transistor circuit having at least one input transistor and one output transistor, each of said transistors having a base electrode, an emitter electrode and a collector electrode, said circuit including a coupling transistor having a base electrode, an emitter electrode and a collector electrode, each of said transistors being of the same type, the emitter electrode of said coupling transistor being connected to one of said electrodes other than the base electrode of said input transistor, and the collector electrode of said coupling transistor being connected to the base electrode of said output transistor.

16. In a transistor circuit having at least two input transistors and at least one output transistor, each of said transistors having a base electrode, an emitter electrode and a collector electrode, said circuit including a coupling transistor having a base electrode, at least two emitter electrodes and a collector electrode, each of said transistors being of the same type, said base electrode of said coupling transistor being connected to a source of current to bias said base electrode at a voltage greater than the sum of the turn-on voltage of said coupling transistor and the turn-on voltage of said output transistor, said emitter electrodes of said coupling transistor being connected to the same one of said electrodes of said input transistors other than the base electrode and the collector electrode of said coupling transistor being connected to the base electrode of said output transistor.

17. In a transistor circuit having at least one input transistor and at least one output transistor, and a coupling transistor, each of said transistors being of the NPN type and including an emitter electrode, a collector electrode and a base electrode, the emitter electrode of said input transistor being connected to ground, the emitter electrode of said coupling transistor being connected to the collector electrode of said input transistor, the collector electrode of said coupling transistor being connected to the base electrode of said output transistor, and biasing means for establishing a voltage at the base electrode of said coupling transistor of a value greater than the sum of the base-to-collector forward voltage drop of said coupling transistor and the base-to-emitter saturation voltage of said output transistor.

18. In a transistor circuit having at least one input transistor and at least one output transistor and a coupling transistor, each of said transistors being of the NPN type and having a base electrode, an emitter electrode and a collector electrode, a source of E.M.F. coupled to said base electrode of said coupling transistor, the emitters of said input transistor and said output transistor being coupled to a potential which is less than the potential in the base electrode of said coupling transistor, the emitter electrode of said coupling transistor being connected to the collector electrode of said input transistor and the collector electrode of said coupling transistor being connected to the base electrode of said output transistor.

19. In a transistor circuit having at least one input transistor, at least one output transistor and a coupling transistor, each of said transistors being of the PNP type, each of said transistors having a base electrode, an emitter electrode and a collector electrode, said base electrode of said coupling transistor being coupled to a source of E.M.F., one of said electrodes other than the base electrode of the coupling transistor being connected to one of said electrodes other than the base electrode of said input transistor and the other of said emitter, and collector electrodes of said coupling transistor being connected to the base electrode of said output transistor.

20. In a transistor circuit having at least one input transistor, at least one output transistor and a coupling transistor, each of said transistors being of the PNP type and having a base electrode, an emitter electrode and a collector electrode, said base electrode of said coupling transistor being coupled to a source of E.M.F. to establish a voltage at said base electrode of said coupling transistor which is less than the turn-on voltage of the base-to-emitter saturation voltage of said output transistor, said emitter electrode of said coupling transistor being connected to the collector electrode of said input transistor, and the collector electrode of said coupling transistor being connected to the base electrode of said output transistor.

21. A semiconductor device comprising a body of semiconductor material, said body being of high resistivity material, said body containing a first region of a predetermined conductivity type disposed within and terminating in a first surface of said body; a second region disposed within said first region and terminating in said first surface, said second region being of the opposite conductivity type from that of said first region; a third region surrounding and adjacent to said first region, said third region terminating in said first surface and being of the opposite conductivity type from that of said first region; and a fourth region surrounding said third region and being of the opposite conductivity type from that of said third region and terminating in said first surface.

22. In a transistor circuit having at least one input transistor and at least one output transistor, each of said transistors having a base electrode, an emitter electrode and a collector electrode, said circuit including a coupling transistor having a base electrode, at least two emitter electrodes and a collector electrode, each of said transistors being of the same type, said base electrode of said coupling transistor being coupled to a source of current, each of said emitter electrodes of said coupling transistor being coupled to one of the electrodes other than the base electrode of each of the input transistors, the collector electrode of said coupling transistor being coupled to the base electrode of said output transistor.

23. In a transistor circuit having at least two input transistors and at least one output transistor, each of said transistors being of the NPN type and including an emitter electrode, a collector electrode and a base electrode, said circuit including a coupling transistor of the NPN type, said coupling transistor having at least two emitter electrodes, a base electrode and a collector electrode, the emitter electrodes of each of said input transistors being connected to ground, the emitter electrodes of said coupling transistors being connected to the collector electrodes of said input transistors, the collector electrode of said coupling transistor being connected to the base electrode of said output transistor, and biasing means for establishing a voltage at the base electrode of said coupling transistor of a value greater than the sum of the base-to-collector forward voltage drop of said coupling transistor and the base-to-emitter saturation voltage of said output transistor.

24. In a transistor circuit having at least one input transistor and at least one output transistor, each of said transistors having a base electrode, an emitter electrode and a collector electrode, said circuit including a coupling transistor having a base electrode, an emitter electrode and a collector electrode, each of said transistors being of the same type, said base electrode of said coupling transistor being coupled to a source of current, one of said electrodes other than the base electrode of said coupling transistor being coupled to one of said electrodes other than the base electrode of said input transistor and the other of said emitter and collector electrodes of said coupling transistor being coupled to the base electrode of said output transistor, the base electrode and the other electrodes of said input transistor adapted to be connected to an input circuit, and the emitter and collector electrodes of said output transistor adapted to be connected to an output circuit.

25. In a transistor circuit having input circuit means and at least one coupling transistor and one other transistor coupled to said coupling transistor, each of said transistors being of the same type and having a base electrode, an emitter electrode and a collector electrode, the base electrode of said coupling transistor being coupled to a source of current, one of said electrodes other than the base electrode of said coupling transistor being coupled to the base electrode of said other transistor, and the other of said electrodes, other than the base electrode of said coupling transistor being coupled to said input circuit means, the emitter and collector electrodes of said other transistor adapted to be connected to an output circuit.

26. In a transistor circuit having output circuit means and at least one coupling transistor and one other transistor coupled to said coupling transistor, each of said transistors being of the same type and having a base electrode, an emitter electrode and a collector electrode, the base electrode of said coupling transistor being coupled to a source of current, one of said electrodes other than the base electrode of said coupling transistor being coupled to one of the electrodes other than the base electrode of said other transistor, and the other of said electrodes other than the base electrode of said coupling transistor being coupled to said output circuit means, the base electrode and the other electrode of said other transistor adapted to be connected to an input circuit.

27. A semiconductor device comprising a body of semiconductor material, said body being of high resistivity material, said body containing a first region of a predetermined conductivity type disposed within and terminating in a first surface of said body; a second region disposed within said first region and terminating in said first surface, said second region being of the opposite conductivity type from that of said first region; a third region surrounding and adjacent to said first region, said third region terminating in said first surface and being of the opposite conductivity type from that of said first region, said third region extending to a depth within said body which is less than that of the depth of said first region; and low resistance ohmic contacts to at least one of said first and second regions.

28. A semiconductor device comprising a body of semiconductor material, said body being of high resistivity material, said body containing a first region of a predetermined conductivity type disposed within and terminating in a first surface of said body; a second region disposed within said first region and terminating in said first surface, said second region being of the opposite conductivity type from that of said first region; a third region surrounding and adjacent to said first region, said third region terminating in said first surface and being of the opposite conductivity type from that of said first region, said third region having a cross-sectional profile such that the surface of said first region opposite said first surface of said body directly communicates with the high resistivity portion of said body underlying said first region; and low resistance ohmic contacts to at least one of said first and second regions.

References Cited by the Examiner

UNITED STATES PATENTS

| | | | |
|---|---|---|---|
| 2,877,310 | 3/1959 | Donald | 330—20 |
| 2,913,704 | 11/1959 | Choang Huang | 307—88.5 |
| 2,985,804 | 5/1961 | Buie | 307—88.5 |
| 3,001,144 | 9/1961 | Dandl | 330—20 |
| 3,090,873 | 5/1963 | Mackintosh | 307—88.5 |

ARTHUR GAUSS, *Primary Examiner.*

J. BUSCH, *Assistant Examiner.*

UNITED STATES PATENT OFFICE
CERTIFICATE OF CORRECTION

Patent No. 3,283,170

November 1, 1966

James L. Buie

It is hereby certified that error appears in the above numbered patent requiring correction and that the said Letters Patent should read as corrected below.

Column 3, line 75, for "metter" read -- better --; column 4, line 64, for "constant circuit" read -- constant current --; column 14, line 41, for "11." read -- 12. --.

Signed and sealed this 15th day of April 1969.

(SEAL)
Attest:

Edward M. Fletcher, Jr.
Attesting Officer

EDWARD J. BRENNER
Commissioner of Patents